United States Patent
Yamakawa et al.

(10) Patent No.: US 10,469,669 B2
(45) Date of Patent: Nov. 5, 2019

(54) INTERCOM SYSTEM

(71) Applicant: AIPHONE CO., LTD., Nagoya-shi, Aichi (JP)

(72) Inventors: Seiya Yamakawa, Nagoya (JP); Syu Kumagai, Nagoya (JP); Akira Kai, Nagoya (JP)

(73) Assignee: AIPHONE CO., LTD., Nagoya-Shi, Aichi (JP)

( * ) Notice: Subject to any disclaimer, the term of this patent is extended or adjusted under 35 U.S.C. 154(b) by 0 days.

(21) Appl. No.: 16/089,340

(22) PCT Filed: Mar. 28, 2016

(86) PCT No.: PCT/JP2016/059814
§ 371 (c)(1),
(2) Date: Sep. 27, 2018

(87) PCT Pub. No.: WO2017/168488
PCT Pub. Date: Oct. 5, 2017

(65) Prior Publication Data
US 2019/0116269 A1 Apr. 18, 2019

(51) Int. Cl.
*H04M 1/60* (2006.01)
*H04M 9/00* (2006.01)
(Continued)

(52) U.S. Cl.
CPC .............. *H04M 9/02* (2013.01); *H03M 1/12* (2013.01); *H04M 11/025* (2013.01); *H04Q 1/30* (2013.01)

(58) Field of Classification Search
USPC .................................................. 379/167.01
See application file for complete search history.

(56) References Cited

U.S. PATENT DOCUMENTS

| | | | | |
|---|---|---|---|---|
| 5,612,994 A | * | 3/1997 | Chen | H04N 7/186 348/14.01 |
| 5,754,637 A | * | 5/1998 | Choi | H04M 9/001 348/14.01 |

(Continued)

FOREIGN PATENT DOCUMENTS

JP 2004-260679 A 9/2004
JP 2004348520 A 12/2004
(Continued)

OTHER PUBLICATIONS

International Search Report and Written Opinion for related International Application No. PCT/JP2016/059814, dated May 31, 2016; English translation of ISR provided; 9 pages.

(Continued)

*Primary Examiner* — Quoc D Tran
(74) *Attorney, Agent, or Firm* — Procopio, Cory, Hargreaves & Savitch LLP

(57) ABSTRACT

An intercommunication system in an apartment complex comprises residential buildings, each including room parent devices installed in respective rooms; a collective entrance device having a call unit enabling a call manipulation for calling a visit destination room parent device; a storage unit stored with a call table having room numbers correlated with pieces of room parent device IDs for identification of the room parent devices, respectively; a processing unit performing processing of converting a signal input to the call unit into the room parent device ID of a call target room parent device based on the call table; and a transmission unit transmitting the room parent device ID to the room parent devices in the building of the terminal device; and a building control unit connecting the collective entrance device to the room parent devices of the rooms of the building of the building control unit, by an intercom line.

12 Claims, 7 Drawing Sheets

(51) Int. Cl.
*H04M 9/02* (2006.01)
*H03M 1/12* (2006.01)
*H04M 11/02* (2006.01)
*H04Q 1/30* (2006.01)

(56) References Cited

U.S. PATENT DOCUMENTS

| | | | | |
|---|---|---|---|---|
| 6,058,174 | A * | 5/2000 | Borshchevsky | H04M 1/0291 379/167.02 |
| 6,226,370 | B1 * | 5/2001 | Shih | H04M 1/723 379/159 |
| 6,671,360 | B2 * | 12/2003 | Sumiya | H04L 12/40032 379/167.15 |
| 6,728,351 | B2 * | 4/2004 | Ahlstrom | H04M 11/025 379/102.06 |
| 6,879,670 | B2 * | 4/2005 | Shinozaki | H04M 1/274525 379/159 |
| 7,007,190 | B1 * | 2/2006 | Kurapati | H04M 7/006 714/4.1 |
| 7,764,775 | B2 * | 7/2010 | Tarkoff | H04M 11/025 379/167.02 |
| 2006/0072469 | A1 * | 4/2006 | Tazaki | H04L 29/06027 370/242 |
| 2007/0047712 | A1 * | 3/2007 | Gross | H04M 11/025 379/167.01 |
| 2011/0007883 | A1 | 1/2011 | Bingham et al. | |
| 2014/0219431 | A1 * | 8/2014 | Wagner | H04M 11/025 379/167.02 |
| 2018/0027124 | A1 * | 1/2018 | Maruyama | H04M 9/00 379/167.02 |
| 2018/0295243 | A1 * | 10/2018 | Shimomura | H04M 11/025 |

FOREIGN PATENT DOCUMENTS

| | | |
|---|---|---|
| JP | 2007-013671 A | 1/2007 |
| JP | 2007-235219 A | 9/2007 |
| JP | 2010-118011 A | 5/2010 |
| JP | 2010177937 A | 8/2010 |
| JP | 2012-015943 A | 1/2012 |
| JP | 2013-211727 A | 10/2013 |

OTHER PUBLICATIONS

Extended European Search Report dated Jun. 14, 2019, issued for International Patent Application No. PCT/JP2016/059814, 8 pgs.
Notice of Reasons for Refusal for related JP App No. 2018-507817 dated Sep. 10, 2019, 7 pgs.

* cited by examiner

Fig.6

| RESIDENTIAL BUILDING-A | | CALL TABLE A1 |
|---|---|---|
| ROOM NO. | DWELLER NAME | ROOM PARENT DEVICE ID |
| 101 | ABE | S1 |
| 102 | TANAKA | S2 |
| 103 | JONES | S3 |
| ⋮ | | ⋮ |

| RESIDENTIAL BUILDING-B | | CALL TABLE B1 |
|---|---|---|
| ROOM NO. | DWELLER NAME | ROOM PARENT DEVICE ID |
| 101 | SUZUKI | T1 |
| 102 | Harry | T2 |
| 103 | Conceal Café | T3 |
| ⋮ | | ⋮ |

⋮

| RESIDENTIAL BUILDING-E | | CALL TABLE E1 |
|---|---|---|
| ROOM NO. | DWELLER NAME | ROOM PARENT DEVICE ID |
| 101 | Restaurant bel | U1 |
| 102 | IIZUKA | U2 |
| 103 | AOKI | U3 |
| ⋮ | | ⋮ |

Fig.7

| RESIDENTIAL BUILDING-A | | CALL TABLE A2 |
|---|---|---|
| ROOM NO. | DWELLER NAME | ROOM PARENT DEVICE ID |
| A101 | ABE | S1 |
| A102 | TANAKA | S2 |
| A103 | JONES | S3 |
| ⋮ | | ⋮ |

| RESIDENTIAL BUILDING-B | | CALL TABLE B2 |
|---|---|---|
| ROOM NO. | DWELLER NAME | ROOM PARENT DEVICE ID |
| B101 | SUZUKI | T1 |
| B102 | Harry | T2 |
| B103 | Conceal Café | T3 |
| ⋮ | | ⋮ |

⋮

| RESIDENTIAL BUILDING-E | | CALL TABLE E2 |
|---|---|---|
| ROOM NO. | DWELLER NAME | ROOM PARENT DEVICE ID |
| E101 | Restaurant bel | U1 |
| E102 | IIZUKA | U2 |
| E103 | AOKI | U3 |
| ⋮ | | ⋮ |

INTERCOM SYSTEM

CROSS-REFERENCE TO RELATED APPLICATIONS

This application is a U.S. National Stage entry of PCT Application No: PCT/JP2016/059814 filed on Mar. 28, 2016, the contents of which are incorporated herein by reference.

TECHNICAL FIELD

The present invention relates to an intercommunication system used in an apartment complex.

BACKGROUND ART

Intercommunication systems for an apartment complex comprising plural residential buildings are known as conventional systems. Such intercommunication systems are configured in such a manner that each residential building is connected to a control apparatus by an intercom line (intercom dedicated line).

PRIOR ART DOCUMENTS

Patent Documents

Patent document 1: JP-A-2004-260679

SUMMARY OF THE INVENTION

Problems to be Solved by the Invention

Patent document 1 discloses an intercommunication system that is configured in such a manner that a control apparatus connected to individual residential buildings manages call signals etc. sent from the individual residential buildings intensively. Thus, the processing ability of the control apparatus needs to be enhanced according to increase in the number of residential buildings, resulting in cost increase.

An object of the invention is therefore to provide an intercommunication system capable of suppressing cost increase that depends on the number of dwelling units.

Means for Solving the Problems

To attain the above object, the invention provides an intercommunication system which is used in an apartment complex comprising plural residential buildings, each of the residential buildings comprising:
  room parent devices installed in respective rooms;
  a terminal device comprising:
  a call unit which enables a call manipulation for calling a visit destination room parent device;
  a storage unit which is stored with a call table in which room numbers of the rooms are correlated with pieces of room parent device identification information for identification of the room parent devices of the rooms, respectively;
  a processing unit which performs processing of converting a signal that is input to the call unit into the room parent device identification information of a call target room parent device on the basis of the call table; and
  a transmission unit which transmits the room parent device identification information to the room parent devices in the building where the terminal device is installed; and
  a building control unit which connects the terminal device to the room parent devices of the rooms of the building where the building control unit is installed, by an intercom line, wherein:
  the plural residential buildings are connected to each other by a network in which a communication is performed according to a general-purpose protocol.

According to this configuration, since signal processing for calling a room parent device from the management room parent device (e.g., collective entrance device or management room parent device) is completed in each residential building, it is not necessary to provide a control apparatus for managing, intensively, call signals coming from the residential buildings. As a result, it is not necessary to prepare a control apparatus whose processing ability corresponds to the number of dwelling units, whereby cost increase can be suppressed. Even in the event of a change of, for example, increasing the number of residential buildings in the middle of execution of an overall plan of an apartment complex, in terms of the system configuration, it suffices to connect a new residential building to the network in which a communication is performed according to the general-purpose protocol. Thus, it is not necessary to re-design a high-performance control apparatus and hence cost increase due to the plan change can be suppressed.

In the intercommunication system according to the invention, the building control unit of each of the plural residential buildings may comprise a building controller having:
  a first conversion unit which performs processing of converting a signal that can be communicated through the intercom line in the building where the building control unit is installed into a signal that can be communicated through the network according to the general-purpose protocol; and
  a second conversion unit which performs processing of converting a signal that can be communicated through the network according to the general-purpose protocol into a signal that can be communicated through the intercom line in the building where the building control unit is installed.

According to this configuration, even if different signal formats are used in the intercom lines of the respective residential buildings, a single system can be constructed by connecting the residential buildings by the network in which a communication is performed according to the general-purpose protocol.

The intercommunication system according to the invention may be such that:
  an intensive building is further connected to the network in which a communication is performed according to the general-purpose protocol; and
  the intensive building comprises:
  an intensive terminal device capable of calling each of the rooms of the plural residential buildings; and
  an intensive control unit which is connected to the intensive terminal device by an intercom line.

According to this configuration, each room of each residential building can be called from the intensive building over the network in which a communication is performed according to the general-purpose protocol.

The intercommunication system according to the invention may be such that:
  the intensive control unit comprises:
  a third conversion unit which performs processing of converting a signal that can be communicated through the intercom line in the intensive building into a signal that can be communicated through the network according to the general-purpose protocol; and a fourth conversion unit which performs processing of converting a signal that can be communicated through the network according to the general-purpose protocol into a signal that can be communicated through the intercom line in the intensive building; and the building controller in each of the plural residential buildings comprises:

a building storage unit which is stored with the call table for the building where the building control unit is installed;

a building processing unit which performs processing of converting a signal that is input to the intensive terminal device into room parent device identification information of a call target room parent device on the basis of the call table for the building where the building control unit is installed; and a building transmission unit which transmits the room parent device identification information to the room parent devices in the building where the building control unit is installed.

In this configuration, a master call table for the residential buildings is stored in the building controllers of the residential buildings in a distributed manner. Thus, a configuration can be implemented in which all the rooms of all the residential buildings can be called from the intensive building without the need for installing, in the system, an intensive control apparatus having call tables for all the rooms of all the residential buildings.

Advantages of the Invention

The intercommunication system according to the invention can suppress cost increase that depends on the number of dwelling units.

BRIEF DESCRIPTION OF THE DRAWINGS

FIG. 6 shows example call tables A1-E1 which are stored in terminal devices of residential building-A to residential building-E.

FIG. 7 shows example call tables A2-E2 which are stored in building control units of residential building-A to residential building-E, respectively.

EMBODIMENTS OF THE INVENTION

An exemplary embodiment will be hereinafter described with reference to the drawings.

Figure 1:
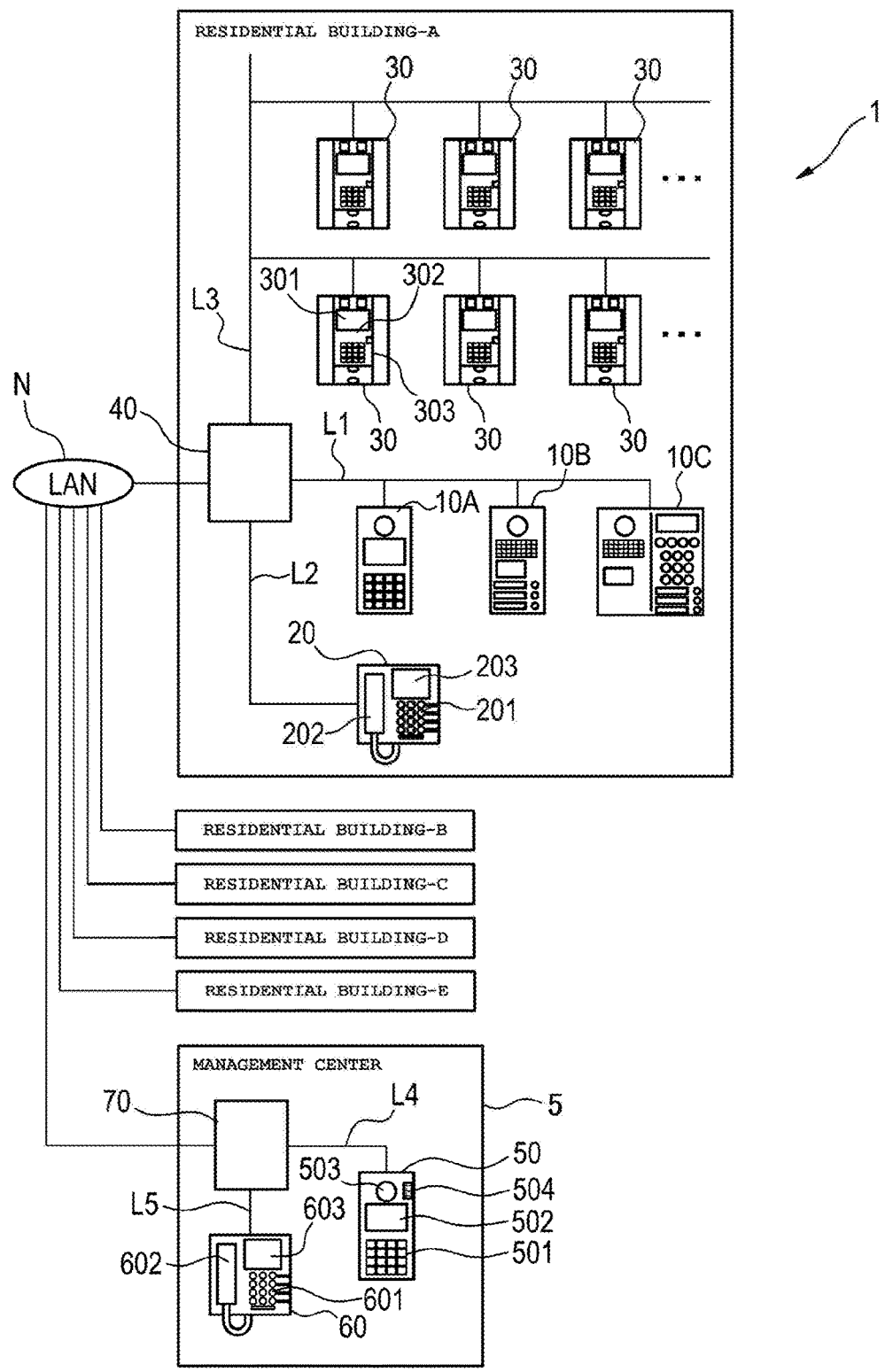
FIG. 1 shows the configuration of an intercommunication system according to an embodiment of the present invention.

As shown in FIG. 1, an intercommunication system 1 is a system used for an apartment complex comprising plural residential buildings (in the embodiment, residential building-A to residential building-E). The intercommunication system 1 is equipped with, in each of residential building-A to residential building-E, collective entrance devices 10A, 10B and 10C (example terminal devices), a management room parent device 20 (example terminal device), room parent devices 30, and a building control unit 40. FIG. 1 which relates to the embodiment shows these devices and unit only for residential building-A. The residential buildings are connected to each other by a network N (in the embodiment, LAN (local area network)) in which a communication is performed according to a general-purpose protocol. The intercommunication system 1 is provided with a management center 5 (example intensive building) which is connected to the individual residential buildings by the network N.

The collective entrance devices 10A, 10B, and 10C (hereinafter may be referred to as a generic term "collective entrance device(s) 10") are installed in, for example, each collective entrance or shared space of the apartment complex. The collective entrance devices 10 are configured so as to be able to call, for example, a room parent device 30 or the management room parent device 20 in the building where it is installed. Furthermore, the collective entrance devices 10 are configured so as to be able to take an image of a visitor, for example. For example, the collective entrance devices are of a type in which a room number is to be input using a ten-key unit (collective entrance device 10A), a type in which a dedicated button that is correlated with a name is to be pushed (collective entrance device 10B), or of a composite type of the type with the ten-key unit and the type with the dedicated buttons (collective entrance device 10C). The collective entrance devices 10 are connected to the building control unit 40 by an intercom line (dedicated line) L1 so as to be able to communicate with it.

The management room parent device 20 is installed in each management room of the apartment complex. The management room parent device 20 is configured so as to be able to call, for example, a room parent device 30 in the building where it is installed. Equipped with a manipulation unit 201, a conversation unit 202, a display unit 203, etc., the management room parent device 20 is configured so as to enable a phone conversation with a visitor standing near a collective entrance device 10 or a dweller standing near a room parent device 30. The management room parent device 20 is connected to the building control unit 40 by an intercom line L2 so as to be able to communicate with it.

The room parent device 30 is installed in each dwelling unit of the apartment complex. Equipped with a display unit 301, a manipulation unit 302, a conversation unit 303, etc., the room parent device 30 is configured so as to be able to respond to a call from, for example, a collective entrance device 10 or the management room parent device 20. The individual room parent device 30 is stored with information for identification of it (e.g., room parent device ID (identification)). The room parent device 30 is connected to the building control unit 40 by an intercom line L3 so as to be able to communicate with it.

The building control unit 40 controls, for example, a communication with the collective entrance devices 10, the management room parent device 20, and the room parent devices 30 which are connected to it by the intercom lines. The building control unit 40 is connected to the building control units 40 of the other residential buildings (in the embodiment, residential building-B to residential building-E) and an intensive control unit 70 (described later) of the management center 5 by the network N so as to be able to communicate with them.

The management center 5 is configured so as to be able to manage the entire apartment complex, that is, residential building-A to residential building-E, and is equipped with an intensive collective entrance device 50 (example intensive terminal device), an intensive management room parent device (example intensive terminal device), and the intensive control unit 70.

The intensive collective entrance device 50 is installed in an entrance of the management center 5. The intensive collective entrance device 50 has a call unit 501, a display unit 502, a camera 503, a conversation unit 504, etc. The intensive collective entrance device 50 is configured so as to be able to call, for example, a particular room parent device 30 of each building and the intensive management room parent device 60 of the management center 5. The intensive collective entrance device 50 is configured so as to be able to take an image of a visitor, for example. The intensive collective entrance device 50 is connected to the intensive control unit 70 by an intercom line L4 so as to be able to communicate with it.

The intensive management room parent device 60 is installed in a management room of the management center 5. The intensive management room parent device 60 has a manipulation unit 601, a conversation unit 602, a display unit 603, etc. The intensive management room parent device 60 is configured so as to be able to call, for example, a room parent device 30 of each building. The intensive management room parent device 60 is configured so as to enable a phone conversation with a visitor standing near the intensive collective entrance device 50 or a dweller standing near a room parent device 30. The intensive management room parent device 60 is connected to the intensive control unit 70 by an intercom line L5 so as to be able to communicate with it.

The intensive control unit 70 controls, for example, exchange of a communication with the intensive collective entrance device 50 and the intensive management room parent device 60 which are connected to it by the intercom lines. The intensive control unit 70 is connected to the building control unit 40 of each of residential building-A to residential building-E by the network N.

Figure 2:
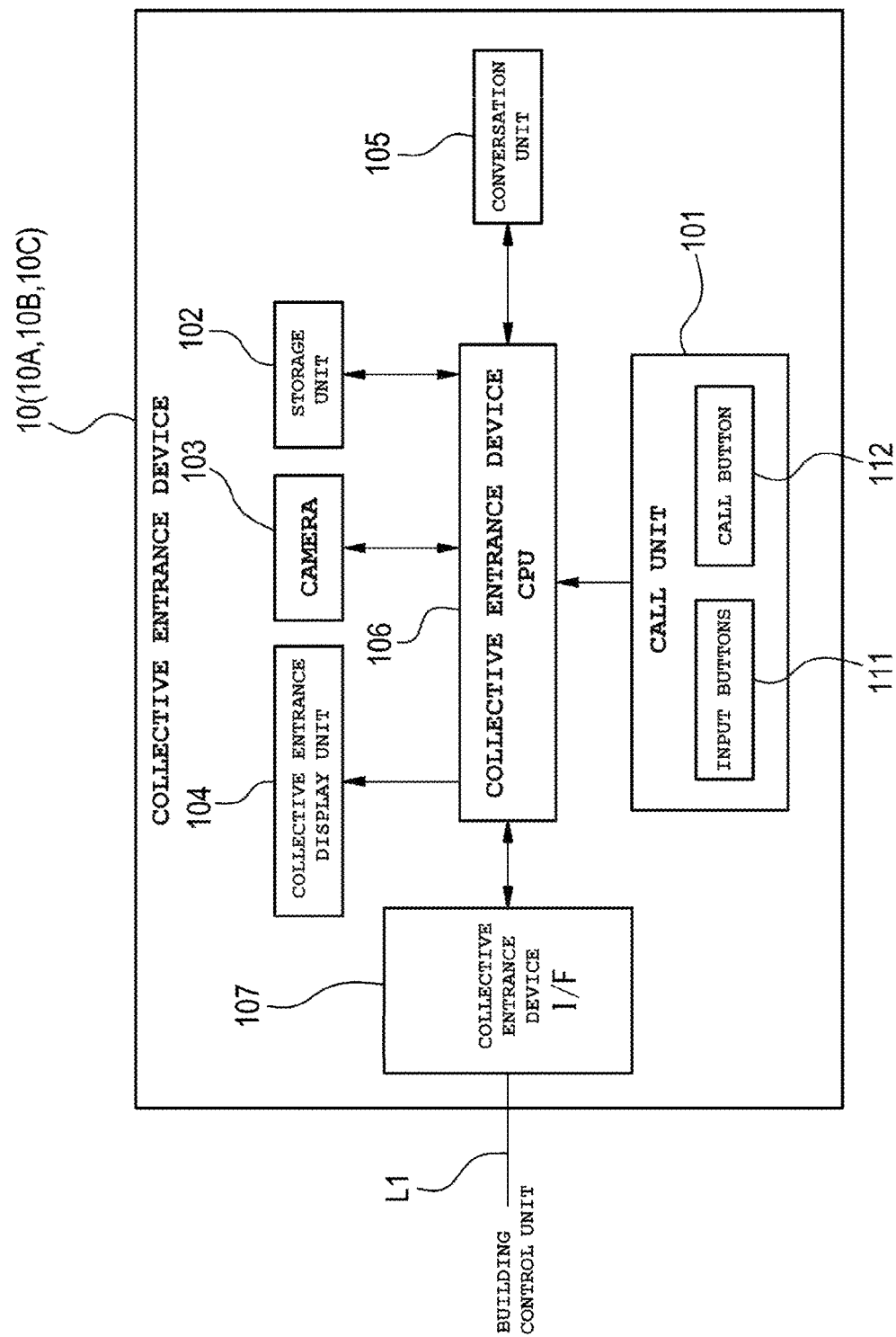
FIG. 2 is a functional block diagram of a collective entrance device.

As shown in FIG. 2, each collective entrance device 10 is equipped with a call unit 101, a storage unit 102, a camera 103, a collective entrance display unit 104, a conversation unit 105, a collective entrance device CPU 106 (example processing unit), and a collective entrance device interface 107 (example transmission unit). (In the following, the term "interface" will be abbreviated as "I/F").

The call unit 101 is manipulated when a visitor or the like calls the room parent device 30 of a visit destination or the management room parent device 20 in the management room. The call unit 101 has input buttons (a ten-key unit, dedicated buttons, or the like) 111, a call button 112 to be manipulated after manipulation of the input buttons, and other things.

The storage unit 102 is stored with, among other information, a call table in which room numbers of the rooms of the building where it is installed are correlated with room parent device IDs for identification of the room parent devices 30 of the rooms, respectively, or a call table in which room numbers of the rooms of the building where it is installed and names of dwellers of rooms and names (e.g., tenant names) of rooms are correlated with room parent device IDs, respectively.

The camera 103 takes an image of a visitor or the like who is manipulating the collective entrance device 10. The collective entrance display unit 104 displays a room number that is input through the call unit 101, a message to the visitor, an image taken by the camera 103, and other information. The conversation unit 105 is composed of a microphone and a speaker for a conversation with a dweller or a manager.

The collective entrance device CPU 106 performs processing for controlling the operation of each of the components of the collective entrance device 10. For example, when a room number or a name is input, the collective entrance device CPU 106 converts an input signal into a room parent device ID of a call target room parent device 30 on the basis of the call table. Furthermore, for example, the collective entrance device CPU 106 runs a driver (software) that allows the collective entrance device 10 to operate. Still further, for example, the collective entrance device CPU 106 restarts the collective entrance device 10 if a bug has occurred in the display contents of the collective entrance display unit 104 or a freeze has occurred.

The collective entrance device I/F 107 forms a bidirectional signal transmission path between the collective entrance device CPU 106 and the intercom line L1.

Although not shown in any drawings, like the collective entrance devices 10, the management room parent device 20 has a storage unit that is stored with a call table and is configured so as to transmit, when a signal indicating a room number or the like is input to the manipulation unit 201, a room parent device ID obtained through conversion on the basis of the call table to each room parent device in the building where it is installed. A terminal device having a function of calling each room parent device 30 may be installed in, for example, a party room that is used as a shared room or a sub-entrance that is different from a main entrance in addition to the ones installed in the collective entrance and the management room.

Figure 3:
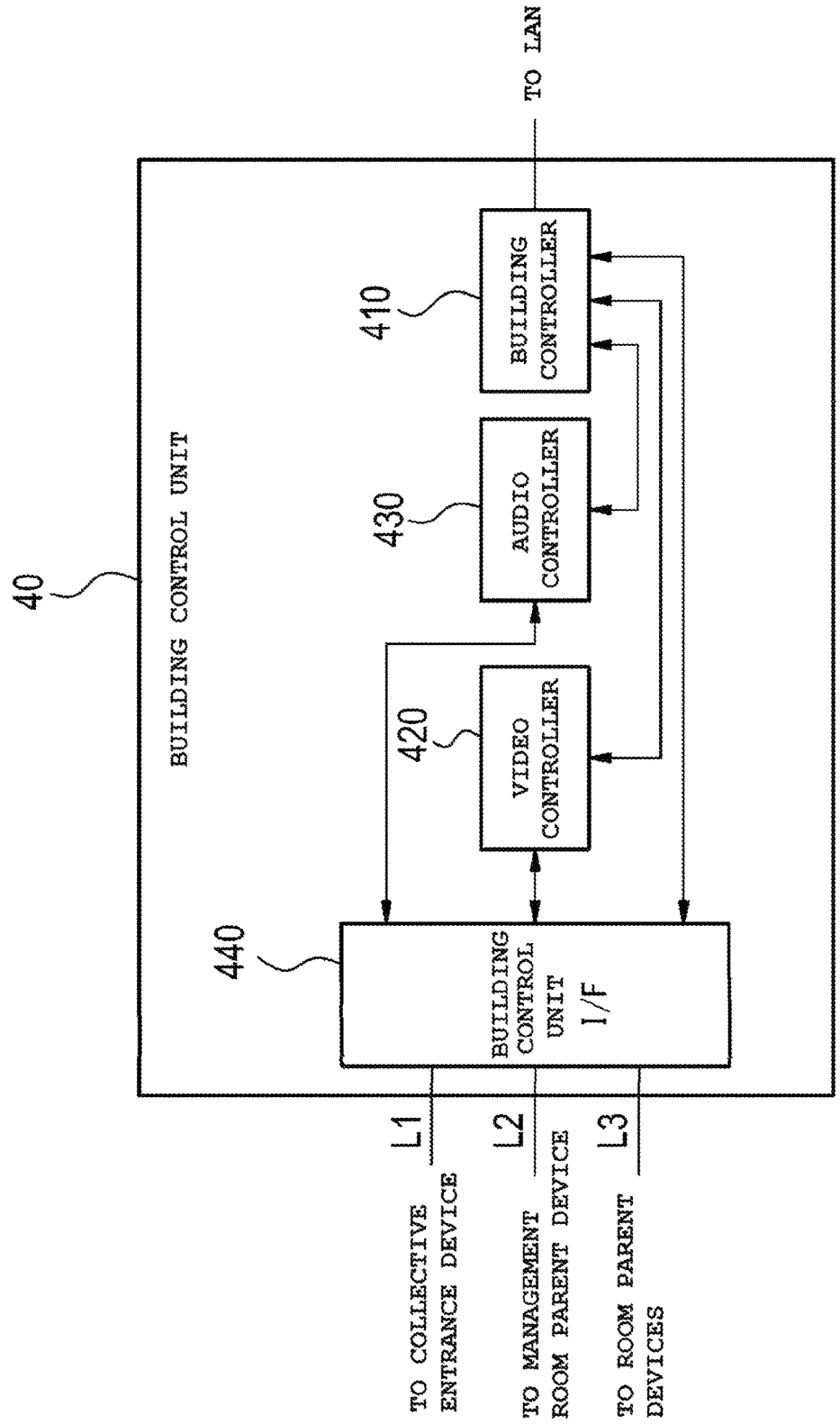
FIG. 3 is a functional block diagram of a building control unit.
Figure 4:
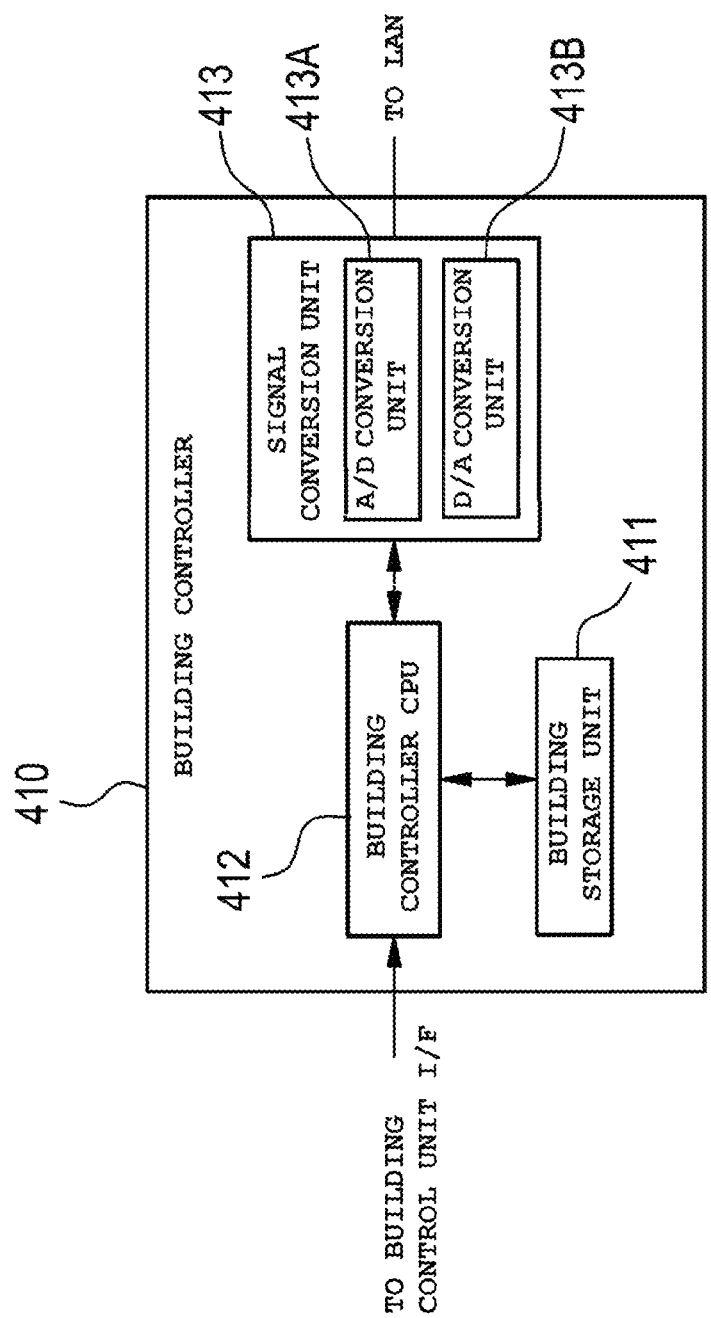
FIG. 4 is a functional block diagram of a building controller.

As shown in FIG. 3, the building control unit 40 is equipped with a building controller 410, a video controller 420, an audio controller 430, and a building control unit I/F 440 (example building transmission unit). As shown in FIG. 4, the building controller 410 is equipped with a building storage unit 411, a building controller CPU 412 (example building processing unit), and a signal conversion unit 413.

The building storage unit 411 of the building controller 410 is stored with, among other information, a call table in which room numbers of the rooms of the building where it is installed are correlated with room parent device IDs for identification of the room parent devices 30 of the rooms, respectively, or a call table in which room numbers of the rooms of the building where it is installed and names of dwellers of rooms and names (e.g., tenant names) of rooms are correlated with room parent device IDs, respectively.

The building controller CPU 412 performs processing for controlling the operation of each of the components of the building controller 410. For example, when a call signal indicating a room number or a name is transmitted from the management center 5, the building controller CPU 412 converts the input signal into a room parent device ID of a call target room parent device 30 on the basis of the call table.

The signal conversion unit 413 is a circuit for performing mutual conversion between a signal used in the intercom lines L1-L3 and a signal used in the network N. The signal conversion unit 413 has an analog-to-digital conversion unit 413A (example first conversion unit) and a digital-to-analog conversion unit 413B (example second conversion unit).

The analog-to-digital conversion unit 413A (in the following, the term "analog-to-digital" will be abbreviated as "A/D") converts an analog signal that can be communicated through the intercom lines L1-L3 in each residential building into a digital signal that can be communicated over the network N between residential buildings and between each residential building and the management center. On the other hand, the digital-to-analog conversion unit 413B (in the following, the term "digital-to-analog" will be abbreviated as "D/A") converts a digital signal that can be communicated over the network N between residential buildings and between each residential building and the management center into an analog signal that can be communicated through the intercom lines in each residential building.

The video controller 420 performs signal processing on a video signal taken by the camera 103 of a collective entrance device 10 or a video signal transmitted from the management center 5 and transmits a resulting video signal to each room parent device 30 or the management room parent device 20 in the building where it is installed. The audio controller 430 performs audio processing on an audio signal transmitted from the conversation unit 105 of a collective entrance device 10, the conversation unit 202 of the management room parent device 20, or the management center 5 and transmits a resulting audio signal to each room parent device 30 or the management room parent device 20 in the building where it is installed.

The building control unit I/F 440 forms a bidirectional signal transmission path between the building controller 410, the video controller 420, and the audio controller 430 and the intercom lines L1-L3.

Figure 5:
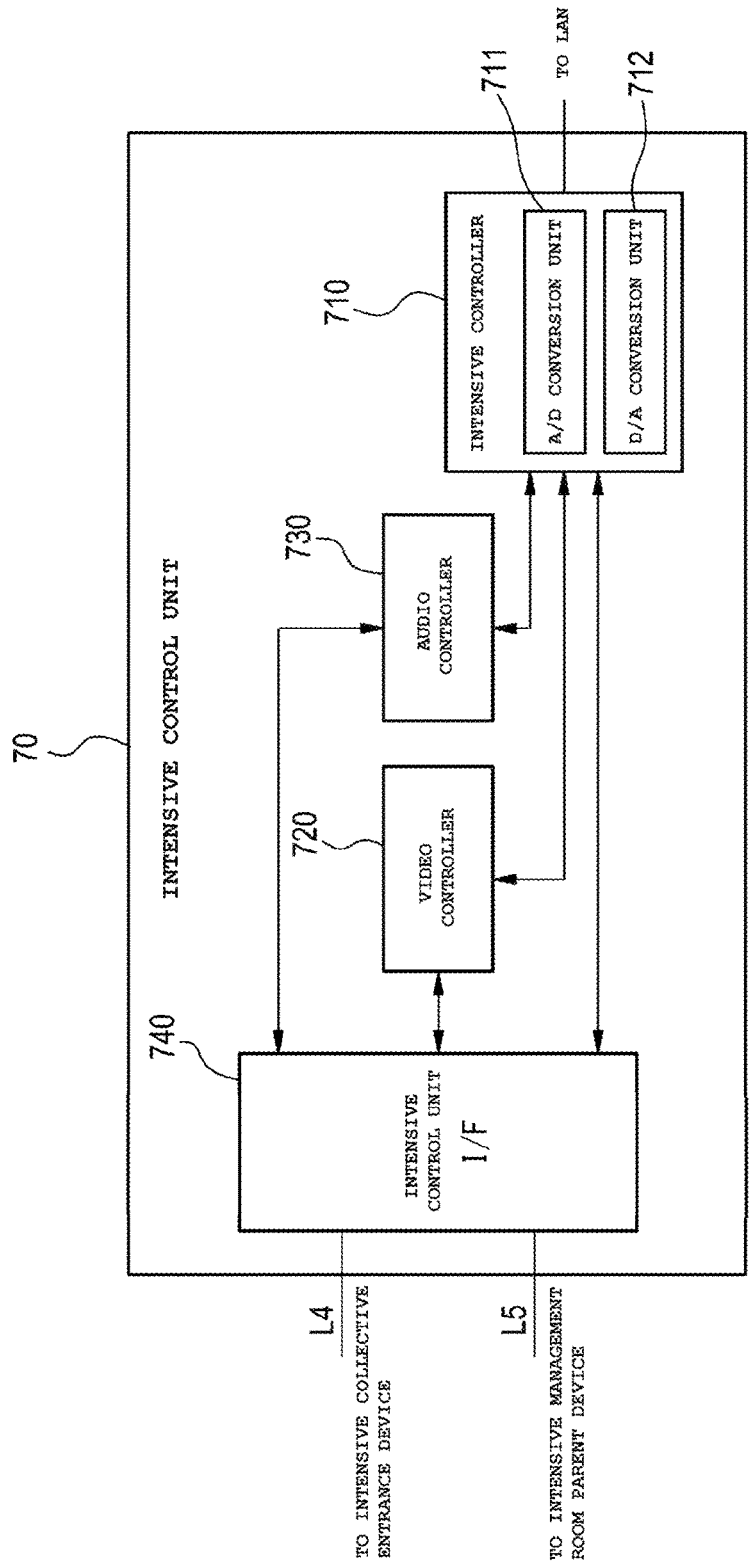
FIG. 5 is a functional block diagram of an intensive control unit.

As shown in FIG. 5, the intensive control unit 70 is equipped with an intensive controller 710, a video controller 720, an audio controller 730, and an intensive control unit I/F 740. The intensive controller 710 is equipped with an A/D conversion unit 711 (example third conversion unit) and a D/A conversion unit 712 (example fourth conversion unit).

The A/D conversion unit 711 of the intensive controller 710 converts an analog signal that can be communicated through the intercom lines L4 and L5 in the management center 5 into a digital signal that can be communicated over the network N between the management center 5 and each residential building. On the other hand, the D/A conversion unit 712 converts a digital signal that can be communicated over the network N between the management center 5 and each residential building into an analog signal that can be communicated through the intercom lines L4 and L5 in the management center 5.

The video controller 720 performs signal processing on a video signal taken by the camera 503 of the intensive collective entrance device 50 and transmits a resulting video signal to the building controller 410 of each residential building. The audio controller 730 performs audio processing on an audio signal transmitted from the communication unit 504 of the intensive collective entrance device 50 or the communication unit 602 of the intensive management room parent device 60 and transmitted a resulting audio signal to the building controller 410 of each residential building.

The intensive control unit I/F 740 forms a bidirectional signal transmission path between the intensive controller 710, the video controller 720, and the audio controller 730 and the intercom lines L4 and L5.

Next, how the intercommunication system 1 operates will be described with reference to FIGS. 6 and 7.

Example Operation-1

The intercommunication system 1 operates in the following manner when a visitor calls a dweller (in this example, a dweller of a room No. 101) of a residential building (in this example, residential building-A) by manipulating a collective entrance device 10 of the residential building.

The room No. "101 (call signal)" is input using, for example, the ten-key unit of a collective entrance device 10 that is installed in residential building-A, and the call button 112 is pushed.

The collective entrance device CPU 106 of residential building-A converts the input call signal "101" into a call signal (e.g., "S1") that is a room parent device ID for identification of a call target room parent device 30 on the basis of a call table A1 (see FIG. 6) stored in the storage unit 102.

The collective entrance device CPU 106 transmits the call signal "S1" to all of the room parent devices 30 in residential building-A via the collective entrance device I/F 107 and the building control unit 40 over the intercom lines. In this case, an image of the visitor taken by the camera 103 is transmitted being attached to the call signal "S1."

Receiving the call signal "S1," each room parent device 30 judges whether "S1" coincides with the room parent device ID stored in itself. If judging that they coincide with each other, the room parent device 30 of the room No. 101 outputs a call sound from the speaker of the conversation unit 303 and displays the image of the visitor on the display unit 301. If the dweller of the room No. 101 pushes a conversation button of the room parent device 30, a conversation signal that approves a response is returned from the room parent device 30 of the room No. 101 to the collective entrance device 10, whereby a signal communication (e.g., conversation) with the collective entrance device 10 is enabled.

The same operation is performed when the room No. 101 is called from the management room parent device 20 as when it is called from the collective entrance device 10.

Example Operation-2

The intercommunication system 1 operates in the following manner when a visitor calls a dweller (in this example, a dweller of a room No. 101) of a desired residential building (in this example, residential building-A) from the management center 5 by manipulating the intensive collective entrance device 50.

"A101 (call signal)" that is the room number plus the residential building name is input using, for example, the ten-key unit of the intensive collective entrance device 50 that is installed in the entrance of the management center 5 and a call button is pushed. The input call signal "A101" is transmitted to the intensive control unit 70 over the intercom line L4.

The intensive controller 710 of the intensive control unit 70 converts the call signal "A101" which is an analog signal that can be communicated through the intercom line into a digital signal that can be communicated through the network N by means of the A/D conversion unit 711. The intensive control unit 70 transmits the resulting call signal "A101" to all of the residential buildings (residential building-A to residential building-E) over the network N.

The building control unit 40 of each residential building converts the call signal "A101" transmitted from the management center 5 into an analog signal that can be transmitted through the intercom lines, by means of the D/A conversion unit 413B of the building controller 410. The building controller CPU 412 of the building controller 410 judges whether the call signal "A101" is a call signal transmitted to the building where it is installed. In this case, the building controller CPU 412 of residential building-A judges that the call signal "A101" is a call signal directed to this building. The building controller CPU 412 of residential building-A transmits a return signal indicating the judgment to that effect to the management center 5 over the network N. The return signal is transmitted after being converted into a digital signal by the A/D conversion unit 413B.

Receiving the return signal, the intensive control unit 70 of the management center 5 again transmits a call signal "A101" to residential building-A over the network N.

The building control unit 40 of residential building-A converts the received call signal "A101" into an analog signal by means of the D/A conversion unit 413B in the same manner as described above. Then the building controller CPU 412 of the building controller 410 converts the input call signal "A101" into a call signal (e.g., "S1") that is a room parent device ID for identification of the call target room parent device 30 on the basis of a call table A2 (see FIG. 7) stored in the building storage unit 411.

The building controller CPU 412 transmits the call signal "S1" to all of the room parent devices 30 of residential building-A via the building control unit I/F 440 over the intercom line L3. In this case, an image of the visitor taken by the camera 503 of the intensive collective entrance device 50 is transmitted being attached to the call signal "S1."

A subsequent part of the operation is the same as in the above-described example operation-1.

The same operation is performed when the room No. 101 of residential building-A is called from the intensive management room parent device 60 as when it is called from the intensive collective entrance device 50.

According to the above-described intercommunication system 1, although the apartment complex consists of the plural residential buildings (residential building-A to residential building-E), since signal processing for calling a room parent device 30 from a collective entrance device 10, the management room parent device 20, or the like is completed in each residential building, it is not necessary to provide a control apparatus for managing, intensively, all of call signals coming from the residential buildings. As a result, it is not necessary to prepare, in the apartment complex, a control apparatus whose processing ability corresponds to the number of all dwelling units of the apartment complex, whereby increase of the equipment cost can be suppressed.

Even in the event of a plan change that causes, for example, increase of the number of residential buildings in the middle of execution of an overall plan of an apartment complex, in terms of the system configuration, it suffices to connect a new residential building to the network N in which a communication is performed according to the general-purpose protocol. Thus, it is not necessary to re-design a high-performance control apparatus even if a plan change occurs on the way, and hence cost increase due to the plan change can be suppressed. Incidentally, where as in conventional cases the entire system is controlled by a single control apparatus, if the control apparatus fails, it affects the entire system. In contrast, in the present configuration, each building control unit 40 whose signal processing is completed in the residential building where it is installed is connected to the network N. Thus, even if one building control unit 40 fails, it suffices to stop operation of that building control unit 40 and repair it; the failure does not affect the entire system. Furthermore, the collective entrance devices in each building have a common call table. Thus, when the call table of one collective entrance device has been damaged, it can be repaired using the call table of another collective entrance device.

The building control unit 40 of each residential building is equipped with the A/D conversion unit 413A and the D/A conversion unit 413B that enable conversion between an analog signal that can be communicated through the intercom lines and a digital signal that can be communicated through the network. Thus, even if, for example, residential buildings employ sets of intercom lines that are different from each other in signal format, a single system can be constructed by all the residential buildings by connecting them by the network N in which a communication is performed according to the general-purpose protocol.

The management center 5 having the A/D conversion unit 711 and the D/A conversion unit 712 in the intensive control unit 70 is connected to the network N, and the call tables A2 etc. (see FIG. 7) for the respective residential buildings are stored in the building control units 40 of the residential buildings, respectively, in a distributed manner. Thus, a configuration can be implemented in which all the rooms of all the residential buildings can be called from the management center 5 over the network N without the need for installing, in the system, a high-performance control apparatus having call tables for all the rooms of all the residential buildings.

The invention is not limited the above embodiment, and various modifications, improvements, etc. can be made as appropriate. And the material, shape, dimensions, related numerical values, form of implementation, number (where plural ones are provided), location, etc. of each constituent element of the embodiment are optional and no limitations are imposed on them as long as the invention can be implemented.

DESCRIPTION OF SYMBOLS

1: Intercommunication system; 5: Management center (example intensive building); 10A-10C: Collective entrance devices (example terminal devices); 20: Management room parent device (example terminal device); 30: Room parent device; 40: Building control unit; 50: Intensive collective entrance device (example intensive terminal device); 60: Intensive management room parent device (example intensive terminal device); 70: Intensive control unit; 101: Call unit; 102: Storage unit; 106: Collective entrance device CPU (example processing unit); 107: Collective entrance device I/F (example transmission unit); 410: Building controller; 411: Building storage unit; 412: Building controller CPU (example building processing unit); 413A: A/D conversion unit (example first conversion unit); 413B: D/A conversion unit (example second conversion unit); 440: Building control unit I/F (example building transmission unit); 710: Intensive controller; 711: A/D conversion unit (example third conversion unit); 712: D/A conversion unit (fourth second conversion unit).

The invention claimed is:

1. An intercommunication system which is used in an apartment complex comprising plural residential buildings, each of the residential buildings comprising:
   room parent devices installed in respective rooms;
   a plurality of terminal devices, each terminal device comprising:
      a call unit which enables a call manipulation for calling a visit destination room parent device;
      a storage unit which is stored with a call table, with information common to each of the plurality of terminal devices, in which room numbers of the rooms are correlated with pieces of room parent device identification information for identification of the room parent devices of the rooms, respectively;

a processing unit which performs processing of converting a signal that is input to the call unit into the room parent device identification information of a call target room parent device on the basis of the call table; and a transmission unit which transmits the room parent device identification information to the room parent devices in the building where the each of the plurality of terminal devices is installed; and a building control unit which connects the each of the plurality of terminal devices to the room parent devices of the rooms of the building where the building control unit is installed, by an intercom line, wherein:

the plural residential buildings are connected to each other by a network in which a communication is performed according to a general-purpose protocol, and wherein when the call table of one of the plurality of terminal devices fails, the call table that has failed of the one of the plurality of terminal devices is repaired using another call table of another one of the plurality of terminal devices.

2. The intercommunication system according to claim 1, wherein the building control unit of each of the plural residential buildings comprises a building controller having:

a first conversion unit which converts a signal that can be communicated through the intercom line in the building where the building control unit is installed into a signal that can be communicated through the network according to the general-purpose protocol; and a second conversion unit which converts a signal that can be communicated through the network according to the general-purpose protocol into a signal that can be communicated through the intercom line in the building where the building control unit is installed.

3. The intercommunication system according to claim 1, wherein:

an intensive building is further connected to the network in which a communication is performed according to the general-purpose protocol; and the intensive building comprises:

an intensive terminal device capable of calling each of the rooms of the plural residential buildings; and an intensive control unit which is connected to the intensive terminal device by an intercom line.

4. The intercommunication system according to claim 3, wherein:

the intensive control unit comprises an intensive controller having:

a third conversion unit which performs processing of converting a signal that can be communicated through the intercom line in the intensive building into a signal that can be communicated through the network according to the general-purpose protocol; and a fourth conversion unit which performs processing of converting a signal that can be communicated through the network according to the general-purpose protocol into a signal that can be communicated through the intercom line in the intensive building; and the building controller in each of the plural residential buildings comprises:

a building storage unit which is stored with the call table for the building where the building control unit is installed;

a building processing unit which performs processing of converting a signal that is input to the intensive terminal device into room parent device identification information of a call target room parent device on the basis of the call table for the building where the building control unit is installed; and a building transmission unit which transmits the room parent device identification information to the room parent devices in the building where the building control unit is installed.

5. The intercommunication system according to claim 1, wherein one building control unit is located in each of the residential buildings connected by a network to other ones of building control units of other ones of residential buildings, wherein when the one building control unit of the each of the residential buildings fails, the other ones of building control units of the other ones of residential buildings do not fail.

6. The intercommunication system according to claim 1, wherein the call table that has failed of the one of the plurality of terminal devices is repaired wirelessly through a network.

7. A method for establishing an intercommunication system which is used in an apartment complex comprising plural residential buildings, having room parent devices in respective rooms, a plurality of terminal devices, and a building control unit, the method comprising:

for each of the plurality of terminal devices, enabling a call manipulation for calling a visit destination room parent device, storing a call table, with information common to each of the plurality of terminal devices, in which room numbers of the rooms are correlated with pieces of room parent device identification information for identification of the room parent devices of the rooms, respectively, converting a signal that is input to one of the plurality of terminal devices into the room parent device identification information of a call target room parent device based on the basis of the call table, and transmitting the room parent device identification information to the room parent devices in the building where the one of the plurality of terminal devices is installed;

connecting the plurality of terminal devices to the room parent devices of the rooms of the building where the building control unit is installed, by an intercom line, wherein the plural residential buildings are connected to each other by a network in which a communication is performed according to a general-purpose protocol; and for the call table of one of the terminal devices of the plurality of terminal devices failing, repairing the failed call table by using the call table of one of the other terminal devices of the plurality of terminal devices.

8. The method according to claim 7, the method further comprising:

converting a signal, via the building control unit, that can be communicated through the intercom line in the building where the building control unit is installed into a signal that can be communicated through the network according to the general-purpose protocol into a signal that can be communicated through the intercom line in the building where the building control unit is installed.

9. The method according to claim 7, the method further comprising:

connecting an intensive building, with an intensive terminal device and an intensive control unit, to the network to establish a communication according to the general-purpose protocol, wherein the intensive terminal device calls each of the rooms of the plural residential buildings, and the intensive control unit is connected to the intensive terminal device by an intercom line.

10. The method according to claim 9, the method further comprising:

converting a signal, via the intensive control unit, that can be communicated through the intercom line in the intensive building into a signal that can be communicated through the network according to the general-purpose protocol; and converting a signal, via the intensive control unit, that can be communicated through the network according to the general-purpose protocol into a signal that can be communicated through the intercom line in the intensive building; and storing the call table for the building where the building control unit is installed in the building control unit;

converting a signal, via a building processing unit, that is input to the intensive terminal device into room parent device identification information of a call target room parent device on the basis of the call table for the building where the building control unit is installed; and transmitting the room parent device identification information to the room parent devices in the building where the building control unit is installed via a building transmission unit.

11. The method according to claim 7, wherein one building control unit is located in each of the residential buildings connected by a network to other ones of building control units of other ones of residential buildings, wherein when the one building control unit of the each of the residential buildings fails, the other ones of building control units of the other ones of residential buildings do not fail.

12. The method according to claim 7, wherein the repairing the call table that has failed of the one of the plurality of terminal devices is done wirelessly through a network.

* * * * *